United States Patent [19]

Hattori

[11] 4,424,881

[45] Jan. 10, 1984

[54] SPEAKER ASSEMBLY

[75] Inventor: Kenneth M. Hattori, Bensenville, Ill.

[73] Assignee: Emhart Industries, Inc., Indianapolis, Ind.

[21] Appl. No.: 349,628

[22] Filed: Feb. 17, 1982

[51] Int. Cl.³ .............................................. H05K 5/00

[52] U.S. Cl. .................................... 181/155; 181/150; 181/175; 181/199

[58] Field of Search ............... 181/155, 148, 150, 175, 181/187, 190, 191, 199

[56] References Cited

U.S. PATENT DOCUMENTS

| | | | |
|---|---|---|---|
| 3,716,671 | 2/1973 | Karr | 181/150 |
| 3,989,909 | 11/1976 | Hodsdon et al. | 181/175 X |
| 4,312,258 | 1/1982 | Park | 181/150 |

*Primary Examiner*—Benjamin R. Fuller
*Attorney, Agent, or Firm*—Robert F. Meyer

[57] ABSTRACT

A bi-directional speaker unit is provided by a wedge shaped member having intersecting walls with spaced parallel angled louvers.

The unit is coupled to a base member through a snap on means permitting other type units to be used with the same base member.

6 Claims, 3 Drawing Figures

SPEAKER ASSEMBLY

SUMMARY OF THE INVENTION

The present invention relates to a speaker assembly which, in general, comprises a hollow base member including sidewalls and a top portion having a grille therein, a speaker unit comprising a hollow wedge shaped member including intersecting walls, each having an opening therein, and spaced parallel angled louvers carried in the opening, and coupling means coupling the speaker unit to the base member.

The coupling means includes snap on means which permits various speaker units to be used with the same base member.

BACKGROUND OF THE INVENTION

The present invention pertains to a speaker assembly of the type that is used in alarm systems.

Speaker assemblies of the type described and claimed are, in general, faced with two common problems; namely, providing adequate sound levels to the area or space where the alarm is being used and at the same time, minimizing direct access to the internal components within the assembly by harmful elements such as vermin.

OBJECTS OR FEATURES OF THE INVENTION

Accordingly, it is a feature of the present invention to provide a speaker assembly that enhances sound output in more than one direction.

Another feature of the invention is to provide such a speaker assembly which minimizes direct accessability from an outside harmful environment. Another feature of the invention is to provide a speaker assembly having a speaker unit which utilizes a hollow wedge shaped member with intersecting walls to provide a bi-directional sound output. Still another feature of the invention is to provide such an assembly wherein the speaker unit further includes spaced parallel angled louvers. Another feature of the invention is to provide such a speaker assembly wherein the speaker unit is carried by a base member having a grille for further enhancement of sound output.

In accordance with another feature of the invention, there is provided a coupling means for coupling a speaker unit to a base member that permits interchangeability of various speaker units. Another feature of the invention is to provide such a coupling means whereby the speaker unit may be snapped into place on the base member.

These and other features of the invention will become apparent from the following description taken in conjunction with the accompanying drawings.

DETAILED DESCRIPTION OF THE INVENTION

Figure 1:
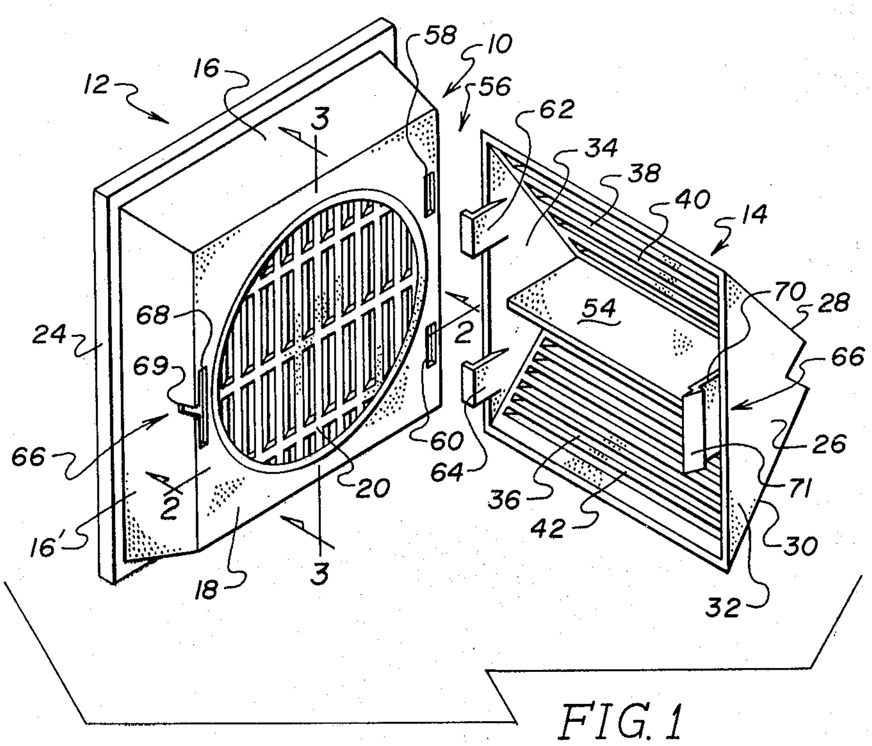
FIG. 1 is an exploded view of a speaker assembly employing the features of the invention.
Figure 2:
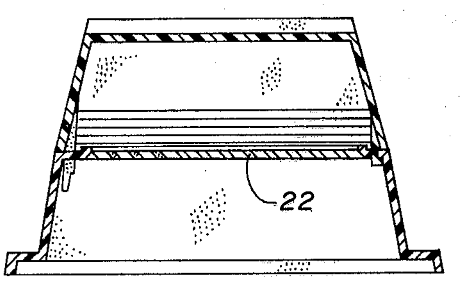
FIG. 2 is a section taken along the line 2—2 of FIG. 1.

Referring now to the drawings, there is shown a speaker assembly 10 which, in general, includes a base member 12 that carries speaker unit 14. Base member 12 includes sidewalls 16 and a top portion 18 in which there is disposed a grille 20. Grille 20 includes a multiplicity of slats or louvers 22 that are disposed at an angle from a vertical axis. Sidewalls 16 include flange member 24 which may be used for mounting the base member where desired.

Figure 3:
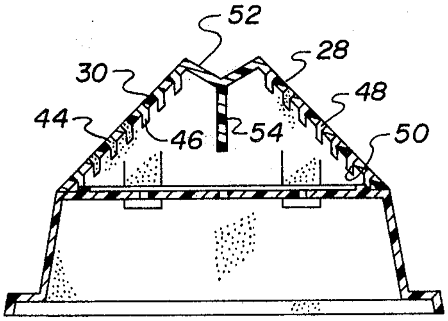
FIG. 3 is a view taken along the line 3—3 of FIG. 1.

Speaker unit 14 includes a hollow wedge shaped member 26 having intersecting walls 28 and 30 and end walls 32 and 34. Each of the intersecting walls has an opening 36 and 38 in which there is carried a multiplicity of louvers 40 and 42. As more clearly shown in FIG. 3, the louvers are angled to provide legs 44, 46, 48 and 50. Legs 44 and 48 are substantially normal to the intersecting walls 28 and 30 while legs 46 and 50 form an obtuse angle with respect to the other legs such that they are substantially axially in line with grille 22 of the base member. The arrangement of the louvers 40 and 42 with respect to the grille 20 of base member 12 provides an enhancement of sound and because of the bi-directional speaker unit enables such sound to be carried through a large space. Further, the angled louvers minimizes direct access to the assembly from outside vermin.

As shown, the intersecting walls 28 and 30 form a V-shaped groove 52. A rib 54 extends along and underneath the groove into the hollow shaped member to further aid in providing a bi-directional sound output.

Speaker unit 14 is coupled to the base member 12 through coupling means 56. Coupling means 56 includes slots 58 and 60 provided in the top portion 18 of the base member and a pair of L-shaped tabs 62 and 64 extending from the speaker unit and engaging the slots and snap on means 66. Snap on means 66 includes a slot 68 provided in the top portion 18 and a spring tab 70 extending from speaker unit 14 and engaging slot 68. Slot 68 is made expandable or otherwise variable in size through a notch 69 provided in sidewall 16' and opening to slot 68. With this arrangement, tabs 62 and 64 are inserted into slots 58 and 60 and speaker unit 14 is pivoted into place with the spring tab 70 being engaged with the expandable slot 68 such that the tongue 71 of the spring tab can be engaged in the slot and lock the speaker unit in place. With this arrangement the speaker unit can be easily replaced with another unit.

What is claimed is:

1. A speaker assembly comprising
(a) a hollow base member including sidewalls and a top portion having a grille therein,
(b) a speaker unit comprising a hollow wedge shaped member including intersecting walls forming a V-shaped groove at an apex of said wedge shaped member, a rib extending along said V-shaped groove, each of said intersecting walls having an opening therein, and spaced parallel angled louvers carried in said opening, and
(c) coupling means coupling said speaker unit to said base member.

2. A speaker unit according to claim 1 wherein said angled louvers form leg means that are substantially normal to a wall of said intersecting walls.

3. A speaker assembly according to claim 2 wherein the legs of said angled louvers are at an obtuse angle to each other.

4. A speaker assembly according to claim 1 wherein said coupling means includes slots in said top portion and tabs extending from said speaker unit engaging said slots and snap on means locking said speaker unit to said base member.

5. A speaker assembly according to claim 6 wherein said snap on means includes a variable size slot in said base member and a spring tab extending from said speaker unit and engaging said variable size slot.

6. A speaker assembly according to claim 1 wherein said grille includes slanted louvers.

* * * * *